US007232593B2

United States Patent
Miteva et al.

(10) Patent No.: US 7,232,593 B2
(45) Date of Patent: Jun. 19, 2007

(54) ALIGNED EMISSIVE POLYMER BLEND, FILM AND DEVICE BASED THEREON

(75) Inventors: Tzenka Miteva, Stuttgart (DE); Gabriele Nelles, Stuttgart (DE); Akio Yasuda, Stuttgart (DE); Andreas Meisel, Frankfurt (DE); Dieter Neher, Potsdam (DE)

(73) Assignee: Sony Deutschland GmbH, Cologne (DE)

( * ) Notice: Subject to any disclaimer, the term of this patent is extended or adjusted under 35 U.S.C. 154(b) by 0 days.

(21) Appl. No.: 10/231,935

(22) Filed: Aug. 30, 2002

(65) Prior Publication Data
US 2003/0064174 A1 Apr. 3, 2003

(30) Foreign Application Priority Data
Sep. 4, 2001 (EP) .................................. 01121177

(51) Int. Cl.
*C09K 11/06* (2006.01)
(52) U.S. Cl. .................. 428/1.31; 428/1.1; 428/690; 428/917; 313/507; 359/265; 252/299.61
(58) Field of Classification Search ................. 428/1.3, 428/690, 917, 1.1, 1.31; 313/507, 504; 359/265; 252/299.01, 299.61, 299.62; 257/79, 86
See application file for complete search history.

(56) References Cited

U.S. PATENT DOCUMENTS 4,769,292 A * 9/1988 Tang et al. ................. 428/690

| | | | |
|---|---|---|---|
| 5,142,343 A * | 8/1992 | Hosokawa et al. ......... 257/103 |
| 5,281,489 A * | 1/1994 | Mori et al. ................. 428/690 |
| 5,391,622 A * | 2/1995 | Ho et al. .................... 525/171 |
| 5,663,573 A * | 9/1997 | Epstein et al. ............... 257/40 |
| 5,747,183 A * | 5/1998 | Shi et al. .................... 428/690 |
| 5,807,974 A * | 9/1998 | Kim et al. .................. 528/366 |
| 6,124,046 A * | 9/2000 | Jin et al. .................... 428/690 |
| 6,127,693 A * | 10/2000 | Chen et al. ................... 257/40 |
| 6,242,561 B1 * | 6/2001 | Mohwald et al. ........... 528/377 |

(Continued)

FOREIGN PATENT DOCUMENTS

EP 1 011 154 6/2000

(Continued)

OTHER PUBLICATIONS

Sainova D et al: "Control of Color and Efficiency of Light-Emitting Diodes Based on Polyfluorenes Blended With Hole-Transporting Molecules" Applied Physics Letters, American Institute of Physics, New York, US, vol. 76, No. 14, Apr. 2000, pp. 1810-1812, XP000905549.

(Continued)

*Primary Examiner*—Rena Dye
*Assistant Examiner*—Sow-Fun Hon
(74) *Attorney, Agent, or Firm*—Oblon, Spivak, McClelland, Maier & Neustadt, P.C.

(57) ABSTRACT

The invention relates to aligned emissive polymer blended with at least one chromophore with rigid-rod-type or discotic asymmetric molecular structure; to film incorporating such polymer blends; to devices incorporating such polymers blends or films, and to uses thereof.

15 Claims, 3 Drawing Sheets

U.S. PATENT DOCUMENTS

Figure 1:
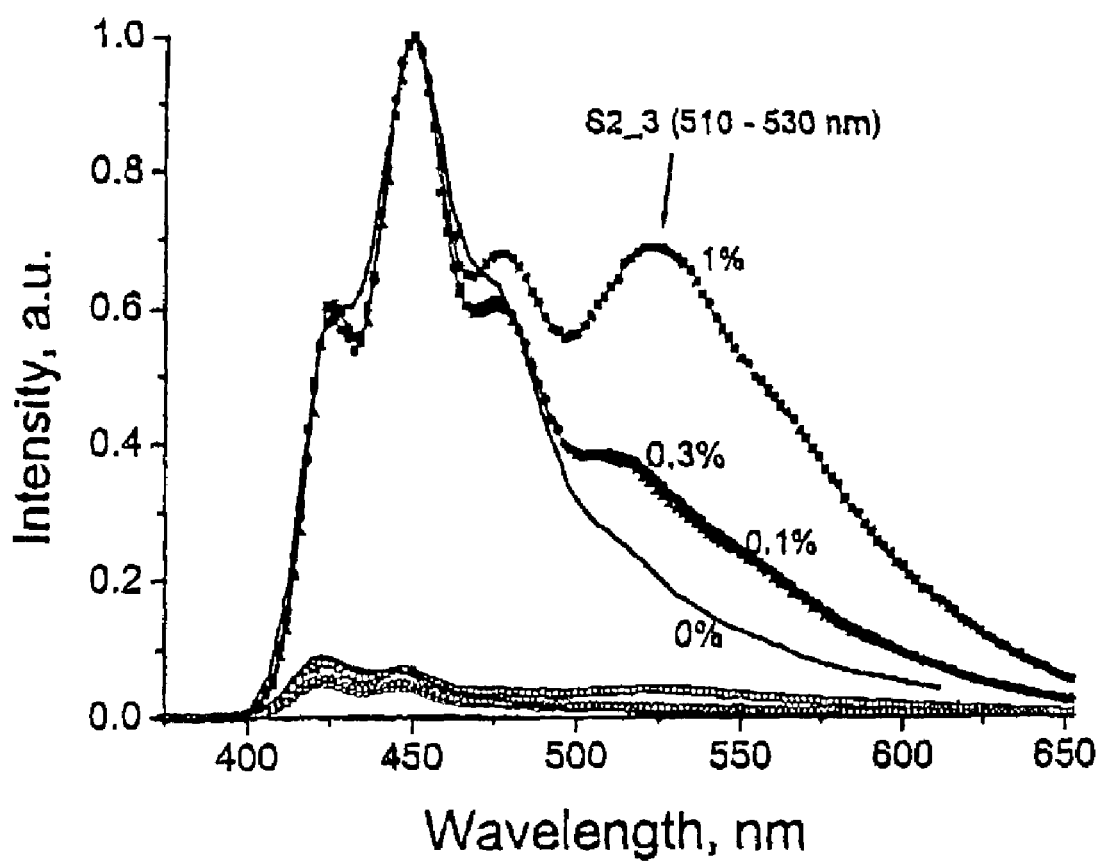

| | | | |
|---|---|---|---|
| 6,255,449 B1 | 7/2001 | Woo et al. | 528/401 |
| 6,309,763 B1 * | 10/2001 | Woo et al. | 428/690 |
| 6,485,884 B2 * | 11/2002 | Wolk et al. | 430/200 |
| 6,621,099 B2 * | 9/2003 | Ong et al. | 257/40 |

FOREIGN PATENT DOCUMENTS

| | | | |
|---|---|---|---|
| JP | 1 074 600 A2 * | 8/2000 | |
| WO | WO 00 60612 | 10/2000 | |
| WO | WO 01/81294 A1 * | 11/2001 | |

OTHER PUBLICATIONS

Miteva T et al: "Polarized Electroluminescence From Highly Aligned Liquid Crystalline Polymers" Synthetic Metals, Elsevier Sequoia, Lausanne, CH, vol. 111/112, Jun. 1, 2000, pp. 173-176, XP000946672.

Grell M et al: "Blue Polarized Electroluminescence From a Liquid Crystalline Polyfluorene" Advanced Materials, VCH Verlagsgesellschaft, Weinheim, DE, vol. 11, No. 8, Jun. 2, 1999, pp. 671-675, XP000850864.

P. Wautelet et al., "Rigid Rod Conjugated Polymers for Nonlinear Optics. 2. Synthesis and Characterization of Phenylene-Ethynylene Oligomers", 1996, *Macromolecules*, vol. 29, No. 1, pp. 446-455.

* cited by examiner

ALIGNED EMISSIVE POLYMER BLEND, FILM AND DEVICE BASED THEREON The present invention relates to aligned emissive polymer, a film and device based thereon.

In recent years, much attention has been paid to polarised emission based on polymers both for electroluminescence (EL) applications and for polarising emissive filters in liquid crystal-line displays (LCD). In the case of EL, polarised backlights for LCDs, light sources for integrated optics and laser diodes are the topics of interest. The use of polarised light emitting diodes (LEDs) as backlights for conventional LCDs could make the polariser as a main component of its structure, with its associated cost, weight and power-inefficient absorptive loss, redundant.

The direct utilisation of a polarised backlight without a "clean-up" polariser requires high polarisation ratios—between 12 and 200 depending on the application.

An approach to such a LED is based on organic small molecules, as for example disclosed in M. Era, T. Tsutsui, S. Saito, Appl. Phys. Lett. 1995, Vol. 67, No. 17, 2436, or H. Tokuhisa, M. Era, T. Tsutsui, Appl. Phys. Lett. 1998. Vol. 72, No. 21, 236, or on conjugated polymers with anisotropic optical properties, which can be oriented into a certain direction. A high degree of molecular alignment in these active LED layers emitting polarised light is a prerequisite for its high polarisation ratios. In the case of conjugated polymers, there is a variety of methods that can be used to align their molecules—Langmuir-Blodgett deposition, as disclosed in V. Cimrova, M. Remmers, D. Neher, G. Wegner, Adv. Mater. 1996, Vol. 8, 146, mechanical alignment via direct rubbing, as for example disclosed in P. Dyreklev, M. Berggren, O. Inganäs, M. R. Andersson, O. Wennerström, T. Hjertberg, Adv. Mater. 1995, Vol. 7, No. 1, 43 and M. Jandke, P. Strohriegl, J. Gmeiner, W. Brütting, M. Schwoerer, Adv. Mater. 11, 1518 (1999)and, if utilising LC polymers, by application of specific alignment layers (with surface anisotropy) and self-organisation, see for example M. Grell, W. Knoll, D. Lupo, A. Meisel, T. Miteva, D. Neher, H. G. Nothofer, U. Scherf, H. Yasuda, Adv. Mater. 11, 671 (1999), or T Miteva, A Meisel, H G Nothofer, U Scherf, W. Knoll, D. Neher, M. Grell, D. Lupo, A. Yasuda, Synth.Met. 2000, 111-112, 173, K. S. Whitehead, M. Grell, D. D. C. Bradley, M Jandke, P. Strohriegl, Appl. Phys. Lett. 2000, Vol. 76, No. 20, 2946.

Most often, the rubbing of polyimide or other polymer layers is the current method of choice in the generation of surface anisotropy to induce LC alignment. Some attractive alternatives are the photochemical modifications of suitable material layers, giving as well a strong anchoring with long term stability, as disclosed in A. E. A. Contoret, S. R. Farrar, P. O. Jackson, S. M. Khan, L. May, M. O Neill, J. E. Nicholls, S. M. Kelly, G. J. Richards Adv. Mater. 12, 971 (2000).

A class of compounds that has been found to be potentially useful in polarised light-emitting diodes and might as well be used for polarised emission filters are polyfluorenes (PF) as conjugated thermotropic (LC) polymers. Various reasons support the use of polyfluorenes: first of all polyfluorenes are displaying impressive blue-emission properties and because of this they received considerable attention with respect to their potential for inclusion into emission layers of LEDs. A second important property of polyfluorenes, in particular polyfluorene homopolymers, is their thermotropic liquid-crystalline behaviour which allows to orient these polymers on alignment layers. Using polyfluorene emissive layers aligned by the means of alignment layer of a rubbed polyimide doped with hole transporting molecules or rubbed PPV layers, polarisation ratios of more than 20 and brightness in excess of 100 cd/m2 have been fabricated, as disclosed, e.g. in Grell W. Knoll, D. Lupo, A. Meisel, T. Miteva, D. Neher, H. G. Nothofer, U. Scherf, H. Yasuda, Adv. Mater. 11, 671 (1999), or T Miteva, A Meisel, HG Nothofer, U. Scherf, W. Knoll, D. Neher, M. Grell, D. Lupo, A. Yasuda, Synth.Met. 2000, 111-112, 173, or K S Whitehead, M. Grell, D. D. C. Bradley, M. Jandke, P. Strohriegel, Appl. Phys. Lett. 2000, Vol. 76, No. 20, 2946.

As appearing from the prior art together with the high degree of molecular alignment in the emissive layer of the LEDs, the efficiency, colour control and stability are extremely important for polarized light emitting structure accomplishment.

The light emitting structures mentioned in the prior art, based on polyfluorene homopolymers, though highly polarised, had efficiency of about 0.12-0.13 cd/A, far too low for practical applications. Several attempts have been made to chemically modify polyfluorenes in order to increase the efficiency of that structures—examples are fluorene-triarylamine copolymers, as disclosed in M. Redecker, D. D. C. Bradley, M. Inbasekaran, W. W. Wu, E. P. Woo, Adv. Mater., 11(3), 241 (1999), and cross-linkable polyfluorenes as disclosed in J. P. Chen, G. Klaemer, J I Lee, D. Markiewitz, V. Y. Lee, R. D. Miller, Synth. Met. 1999, 107, 129. Colour tuning was deliberately achieved via incorporation of benzothiadiazole, perylene, or anthracene moieties into the polyfluorene main chain, see for example G. Klaemer, M. H. Davey, W. D. Chen, J. C. Scott, R. D. Miller, Adv. Mater.10, 993 (1998), or M. Kreyenschmidt, G. Klarner, T. Fuhrer, J. Ashenhurst, S. Karg, W. D. Chen, V. Y. Lee, J. C. Scott, R. D. Miller, Macromolecules 31, 1099 (1998), or Y. He, S. Gong, R. Hattori, J. Kanicki, Appl. Phys. Lett. 74, 2265 (1999).

The problem with the inclusion of such chemical moiety into the polyfluorene main chain is, however, the inevitable modification of essential properties of the main chain such as stiffness and geometrical shape, thereby altering the character of the polyfluorene, for example its liquid-crystalline character, if such had been present before any modification.

It has recently been disclosed, that simple physical addition of a small amount of hole-transporting (HT) molecules leads to a significant improvement in the structure efficiency isotropic polyfluorene based LEDs, see D. Sainova, T. Miteva, H. G. Nothofer, U. Scherf, H. Fujikawa, I. Glowacki, J. Ulanski, D. Neher; Appl. Phys. Lett. 76, 1810 (2000). Further, it has been found that end-capping of the main chain of the polyfluorene homopolymer with HT moieties opens a way to blue LEDs with high efficiency and excellent colour stability, see T. Miteva, A. Meisel, W. Knoll, H G Nothofer, U. Scherf, D C Muller, K. Meerholz, A. Yasuda, D. Neher, Adv. Mater. 13, 565 (2001). These end-capping moieties do not alter the electronic and LC properties of the conjugated polymer backbone, thus allowing as well, for the fabrication of LEDs with polarisation ratios of 22 and very good efficiency.

However, even with the structures based on end-capped polyfluorene homopolymers the efficiency, although being the highest known up to now (0.25 cd/A), is still too low for applications.

It is therefore an object of the present invention, to overcome the drawbacks of the prior art, especially to provide aligned emissive polymer blends useful for incorporation into devices having a polarised light emitting structure resulting in an increased polarisation ratio and a higher efficiency compared to the structures known in the art. Particularly, it is an object of the present invention to provide films, especially emission layers, based on aligned emissive polymers useful for incorporation into such structures. Another object of the present invention is to provide aligned emissive polymers, in particular polyfluorenes, that allow for the fabrication of devices with polarised light emitting structure with higher efficiency.

All these objects are solved by an aligned emissive polymer blended with at least one chromophore with ridig-rod-type or discotic asymmetric molecular structure.

In one embodiment it is preferred that the chromphore is an emissive chromphore with anisotropic electronic structure to yield polarised emission.

A polymer blend is preferred, wherein the chromophore has electronic properties to be active as electron- or hole-trap in a polymer matrix.

In a particularly preferred embodiment the chromophore is a low molecular weight thiophene dye, preferably represented by the formula

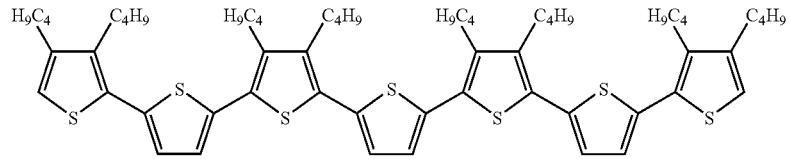

It is preferred that the chromophore is present in the polymer blend in an amount in a range of about 0.005 wt. %—about 10 wt. %, preferably about 0.1 wt. % to 1 wt. %.

In a preferred embodiment the polymer is a liquid-crystalline emissive polymer.

Still preferred is that the polymer is polyfluorene, preferably polyfluorene homopolymer, as e.g. the material PF26 am4 described later on.

Further a polymer blend is preferred, wherein as polymer polyfluorene is end-capped with at least one charge-transporting moiety.

A polymer blend is even more preferred, wherein the polymer is end-capped polyfluorene and the charge-transporting moiety is selected from the group comprising electron-transporting moieties, hole-transporting moieties and ion-transporting moieties.

The objects of the invention are also solved by a film incorporating an aligned emissive polymer blend according to the present invention.

In one embodiment it is preferred that the film be deposited on an alignment layer.

It is further preferred that the film has a thickness ranging from 10 nm to 2 μm.

The objects of the present invention are also solved by a device having a polarised light emitting structure, incorporating an inventive polymer blend.

The objects of the present invention are also solved by a device having a polarised light emitting structure, incorporating a film according to the invention.

The objects of the present invention are also solved by the use of a polymer blend according to the present invention in a film.

According to the invention, an use of an inventive film is preferred, wherein the film is an emission layer.

Uses of an inventive polymer blend and an inventive film are preferred in a device having a polarised light emitting structure, such as polarized light emitting diodes or polarized emission filters.

The objects of the present invention are also solved by the use of a device according to the invention in electroluminescence applications or in polarized emission filters.

The objects of the present invention are also solved by the use of a device according to the invention in combination with a liquid-crystal display (LCD).

Surprisingly, it was found that doping polymers with a specific chromophore yields in improved efficiencies for polarized light emitting structures, for example efficiencies of up to 0.50 cd/A and brightness of about 800 cd/m$^2$ may be obtained. Further, devices having an inventive polarized light emitting structure show better device stability and may be operated more reliably. Moreover, using the inventive polymer blends polarization ratios of up to 28 may be obtained in the inventive devices. Furthermore, the inventive doping of the present invention does not disturb the phase properties of the polyfluorene polymer and does not influence their orientational capabilities.

The terms as used herein are defined as follows:

The term "anisotropic" is a definition describing a substance that exhibits different properties along different axes. Following this definition anisotrophy generally is a description as well for the rigid-rod-type or discotic asymmetric molecular structure—they have anisotropic properties due to the asymmetry of their molecular structure.

The term "charge-transporting moiety" is meant to designate any chemical moiety capable of facilitating the transport of electrons, holes (e.g. charge-deficiencies, particularly electron-deficiencies) and ions. The term furthermore comprises also those groups, that can be transformed into electron-transporting moieties, hole-transporting moieties or ion-transporting moieties, e.g. by protonation, cleavage, proteolysis, photolysis etc.

A "film" is any layer having a thickness selected from the range 10 nm-2 μm, preferably selected from 50-300 nm. Such a film can, e.g., be an emission layer of an optoelectronic device, e.g. an LED. The film can be aligned or non-aligned and prepared by, for example, casting from solution, spin casting, doctor-blading, offset printing, inkjet printing etc. The alignment is preferably achieved by annealing through heating above or close to the transition temperature to the liquid-crystalline phase, but other methods and ways of annealing and aligning are possible, for example by exposition to solvent vapor. The film can be deposited on a specific alignment layer for the purpose of alignment of the molecules in the film, or it can be aligned directly by techniques such as stretching, rubbing etc. Preferable materials for an alignment layer are selected from the group comprising polyimide, nylon, PVA, poly (p-phenylene vinylene), polyamide, teflon (hot rubbed) and glass, but are not restricted thereto. The alignment layer can have its properties induced by rubbing, illumination with polarized light, ion-bombardment, surface-structure induction by grating etc. In a device according to the present invention a film according to the present invention can be used in conjunction with at least one other layer, e.g. another emission layer or several other emission layers, depending on the requirements of the application (in addition to the other layers whose presence is inherently essential for the proper functioning of the device).

The term "in combination with a liquid-crystal display" is meant to designate any arrangement in which a film and/or a device according to the present invention is in physical proximity to a liquid-crystal display (LCD) and/or functionally coupled thereto, e.g. the use of an LED, preferably an LED emitting polarized light, as a backlight for a liquid-crystal display.

Figure 2:
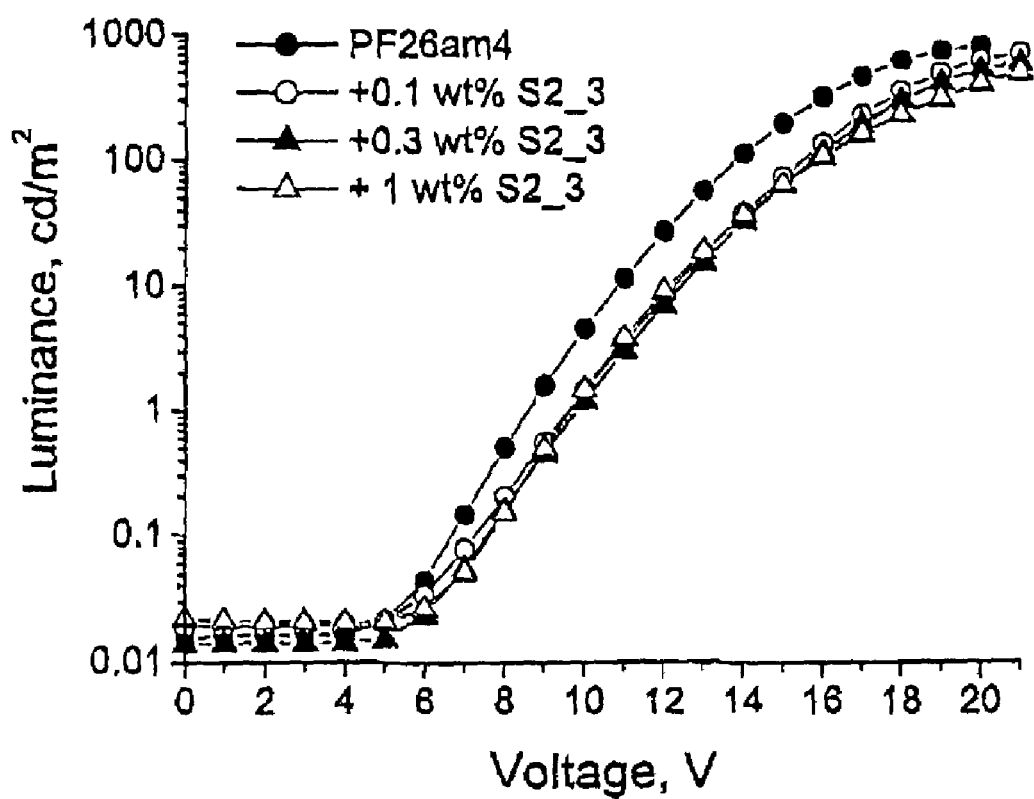
Figure 3:
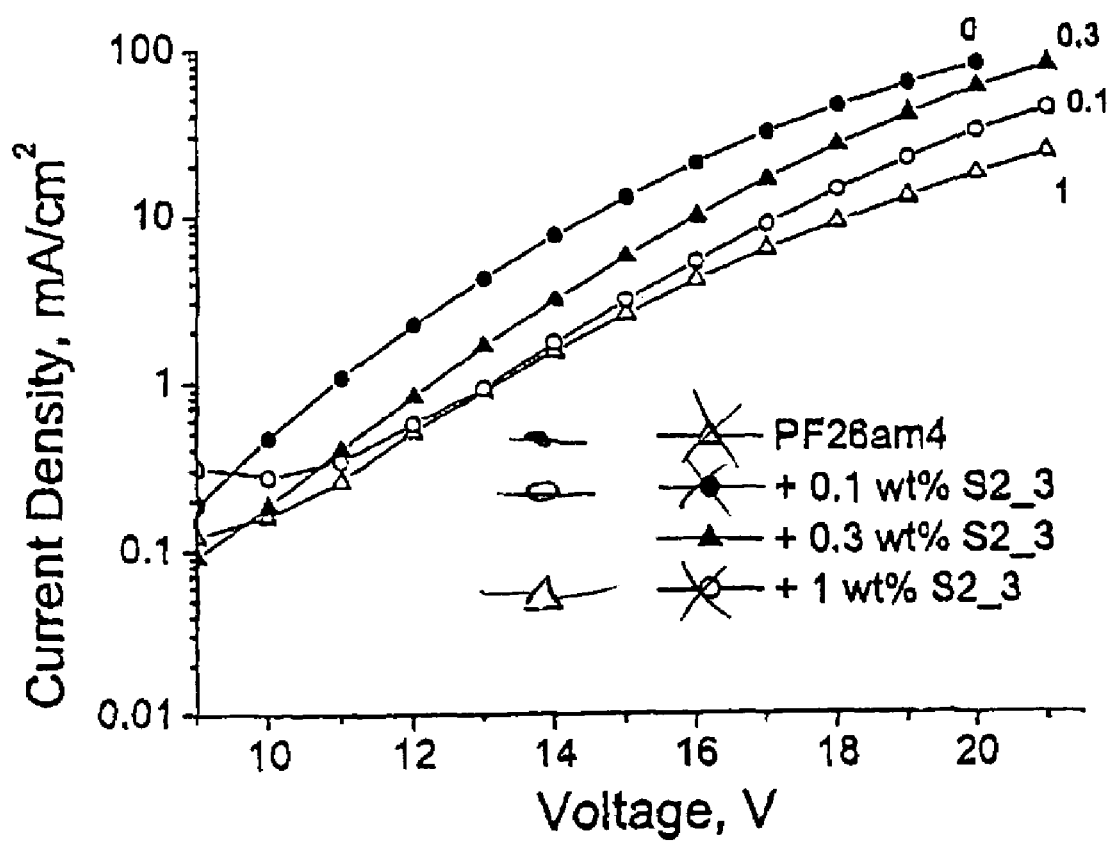

The invention is now being described more fully in the following specific description and the following figures, wherein FIG. 1 shows polarised EL spectra of LEDs with the structure ITO/ST1163/PI+15% ST1163/PF26 am4+x % chromophore/LiF/Ca/Al, wherein the numbers at the curves correspond to the chromophore content;

FIG. 2 shows luminance-voltage curves for LEDs with a structure ITO/ST1163/PI+15% ST1163/PF26 am4+x % chromophore/LiF/Ca/Al; and FIG. 3 shows current-voltage curves for LEDs with a structure ITO/ST1163/PI+15% ST1163/PF26 am4+x % chromophore/LiF/Ca/Al.

Within this detailed description the following abbreviations are used as follows:

ITO: indium doped tin oxide
ST1163: N,N'-Diphenyl-N,N'-bis(4'-(N,N-bis(naphth-1-yl)-amino)-biphenyl-4-yl)-benzidine(purchased form Syntec-Synthon GmbH)
PI: polyimide
PF26 am4: poly(9,9-bis(2-ethylhexyl)fluorene-2,7-diyl) end-capped with 4% bis(4-methylphenyl)phenylamine, represented by the following formula:

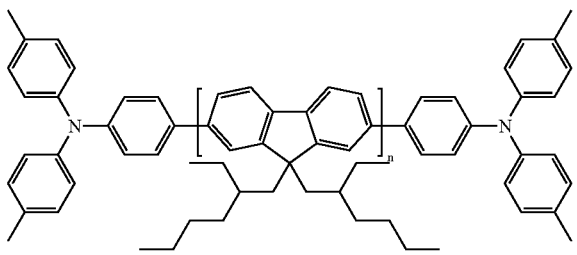

S2_3: thiophene-based dye with the following structure:

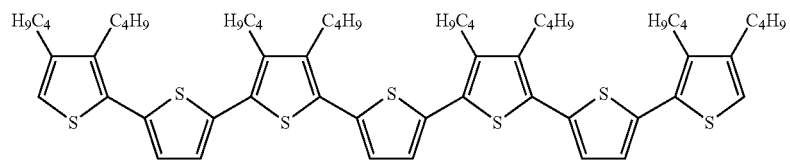

LiF: lithium fluorid
Ca: calcium
Al: aluminium

The following non-limiting example describes the present invention more fully and in a more detailed manner without being intended to limit the present invention.

EXAMPLE

Polarised light emitting structures with active layer of polyfluorene doped with emissive anisoptropic small molecules.

Structure Preparation:

Glass substrates patterned with 100 nm ITO electrodes (Balzers) have been cleaned subsequently in ultrasonic baths of acetone, ionic detergent water solution, ultrapure water (MiliQ unit from Waters) and isopropanol. After drying, a thin layer of N,N'-diphenyl-N,N'-bis(4'-(N,N-bis(naphth-1-yl)-amino)-biphenyl-4-yl) (ST1163), spincoated from Liquicoat (Merck-ZLI 2650 kit solvent) solution at a concentration of 15 g/L at 2300 rpm. Then, the hole-transporting alignment layer was prepared by spincoating a mixture of polyimide (PI) precursor (Merck-ZLI 2650 kit resin) and STI 163 at varying concentrations and a total solid content of 30 g/L in Liquicoat at 1900 rpm for 50 s. After a 15 minute softbake at 80° C., the PI precursor was converted to PI at 270° C. for 1 hour under rotary pump vacuum. Thereafter, the doped PI layer was unidirectionally rubbed using a rubbing machine from E.H.C. Co. Ltd. Japan. The rotating cylinder was covered with rayon cloth and rotated at 1400 rpm. The samples were passed twice under the cylinder at a translating speed of 2.2 mm/s. The depth of impression of the rubbing cloth onto the substrate was approximately 0.8 mm. Films of polyfluorene (PF26 am4) blended with 0.1, 0.3, 0.5 and 1 wt. % of anisotropic thiophene-based dye (S2_3) were spun from a 10 g/L toluene solution onto the rubbed PI alignment layers. The PF blends film thickness were 80 nm. To induce monodomain alignment, samples were annealed in a specific set up in a 0.1 bar Ar-atmosphere at 120° C. for 20 minutes and then cooled down to room temperature at a rate of approximately 5° C./min. The top electrode was deposited by thermal evaporation at a pressure of about $3 \times 10^{-6}$ mbar at a rate of 1 Å/s for the LiF (about 1 nm), 7 Å/s for Ca (20 nm) and 5 Å/s for the Ca-protecting 100 nm thick Al electrode. The overlap between the two electrodes resulted in device areas of 5 mm$^2$.

The emission spectra of the polarised LEDs with active layers of aligned PF26 am4 pure and PF26 am4 blended with different concentrations of the anisotropic thiophene dye S2_3 are shown in FIG. 1. The emission from the devices with an active layer of pure aligned PF26 am4 peaks at 450 nm is low and increases with increasing the content of the dye from 0.1 to 1 wt. %. Most important, the polarisation ratio at 450 nm increased from 15 for the devices with pure PF26 am4 up to 23 for devices with PF26 am4 blended with 0.3 wt. % chromophore (see Table 1 below). The integral polarisation ratio increased from 20 for the devices with pure PF26 am4 up to 28 for devices with PF26 am4 blended with 0.3 wt. % chromophore (see Table 1 below). These, to our knowledge, are the highest reported values for polarisation ratios in electroluminescence.

The results (polarisation ratio at 450 nm, integral polarisation ratio and device efficiency) for the polarised LEDs with active layers of pure PF26 am4 and of PF26 am4 blended with anisotropic thiophene dye with different concentrations are summarized in Table 1 below:

TABLE 1

| S2_3 content, wt. % | P @ 450 nm | P @ 510 nm | P, integral | Brightness, cd/m² | Efficiency, cd/A |
|---|---|---|---|---|---|
| 0 | 15 | 23 | 20 | 800 | 0.25 |
| 0.1 | 21 | 27 | 26 | 720 | 0.50 |
| 0.3 | 23 | 30 | 28 | 600 | 0.30 |
| 1.0 | 15 | 20 | 20 | 500 | 0.50 |

The blending of the thiophene-dye into the polyfluorene at a concentration of 0.1 wt. % led to twice higher device efficiencies in comparison to the devices with pure aligned PF26 am4 active layer at comparable brightness. The integral polarisation ratio increased from 20 (for pure PF26 am4) to 26 (0.1 wt. % dye) and 28 (for 0.3 wt. % dye).

The luminance-voltage curves for the polarised LEDs with active layers of aligned PF26 am4 pure and PF26 am4 blended with different concentrations of the anisotropic thiophene dye S2_3 are shown in FIG. 2 and the current-voltage curve for the same devices are shown in FIG. 3. The overal brightness of the devices very slightly decreases with increasing the concentration of the blended dye (FIG. 2). But, the current density at certain brightness generally decreases strongly with adding 0.1 wt. % of the dye, than slightly increases when the concentration increased to 0.3 wt. % and than further decreases when the dye concentration increases to 1 wt. % (FIG. 3). This leads to the most important results (see also Table 1): The device efficiency for the devices with aligned PF26 am4 blended with anisotropic dye is twice as high (0.5 cd/A) as those of the devices based on pure PF26 am4 aligned layer (0.25 cd/A)(see as well Table 1).

The features disclosed in the foregoing description and the claims may, both separately and in any combination thereof be material for realising the invention in diverse forms therof.

The invention claimed is:

1. An aligned emissive polymer blend, comprising:
   an aligned emissive polymer and
   at least one chromophore having a rigid-rod-type or discotic asymmetric molecular structure,
   wherein the chromophore is represented by the formula:

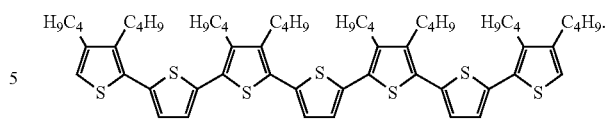

2. The aligned emissive polymer blend according to claim 1, wherein the chromophore has a discotic asymmetric molecular structure.

3. The aligned emissive polymer blend according to claim 1, wherein the chromophore has electronic properties so as to be active as an electron- or hole-trap in polymer matrix.

4. The aligned emissive polymer blend according to claim 1, wherein the chromophore present in the blend in an amount of from about 0.005 wt. % to about 10 wt. %.

5. The aligned emissive polymer blend according to claim 1, wherein the aligned emissive polymer comprises a liquid-crystalline emissive polymer.

6. The aligned emissive polymer blend according to claim 4, wherein the chromophore is present in the blend in an amount of from about 0.1 wt. % to 1 wt.

7. The aligned emissive polymer blend according to claim 1, wherein the aligned emissive polymer comprises polyfluorene.

8. The aligned emissive polymer blend according to claim 7, wherein the polyfluorene is liquid-crystalline polyfluorene homopolymer.

9. The aligned emissive polymer blend according claim 7, wherein the polyfluorene is end-capped with at least one charge-transporting moiety.

10. The aligned emissive polymer blend according to claim 9, wherein the charge-transporting moiety is selected from the group consisting of electron-transporting moieties, hole-transporting moieties and ion-transporting moieties.

11. A film comprising an aligned emissive polymer blend according to claim 1.

12. The film according to claim 11, wherein said film is deposited on an alignment layer.

13. The film according to claim 11, wherein said film has a thickness ranging from 10 nm to 2 μm.

14. A device having a polarised light emitting structure, comprising a film according to claim 11.

15. A device having a polarised light emitting structure, comprising an aligned emissive polymer blend according to claim 1.

* * * * *